(12) United States Patent
Sellers

(10) Patent No.: US 7,301,343 B1
(45) Date of Patent: Nov. 27, 2007

(54) SYSTEM, METHOD AND APPARATUS FOR CONTROLLING THE TEMPERATURE OF A MRI MAGNET WARM BORE

(75) Inventor: Michael Ben Sellers, Dorchester on Thames (GB)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 11/612,101

(22) Filed: Dec. 18, 2006

(51) Int. Cl.
G01V 3/00 (2006.01)
(52) U.S. Cl. .................................... 324/318
(58) Field of Classification Search ............ 324/318, 324/319, 320, 322
See application file for complete search history.

(56) References Cited

U.S. PATENT DOCUMENTS 6,992,483 B1 * 1/2006 Emeric et al. ............ 324/300
7,135,863 B2 * 11/2006 Arik et al. ............... 324/318
2001/0042385 A1 * 11/2001 Kaindl et al. ............. 62/436
2002/0156595 A1 * 10/2002 Hedlund et al. ........... 702/132
2007/0080689 A1 * 4/2007 Konijn et al. ............. 324/318

* cited by examiner

Primary Examiner—Louis M. Arana

(57) ABSTRACT

An apparatus for cooling a gradient coil assembly of a magnetic resonance imaging (MRI) system and for controlling a temperature of a magnet warm bore is provided. The gradient coil assembly includes an inner gradient coil assembly and an outer gradient coil assembly. A first cooling circuit is provided that has a cooling tube positioned at a distance from the inner gradient coil assembly. The cooling tube of the first cooling circuit is configured to transport a first coolant having a first temperature. A second cooling circuit is provided that has a cooling tube positioned at a distance from the outer gradient coil assembly. The cooling tube of the second cooling circuit is configured to transport a second coolant having a second temperature. The apparatus also includes a controller coupled to the first cooling circuit and the second cooling circuit. The controller is configured to independently control the first temperature of the first coolant and the second temperature of the second coolant.

16 Claims, 5 Drawing Sheets

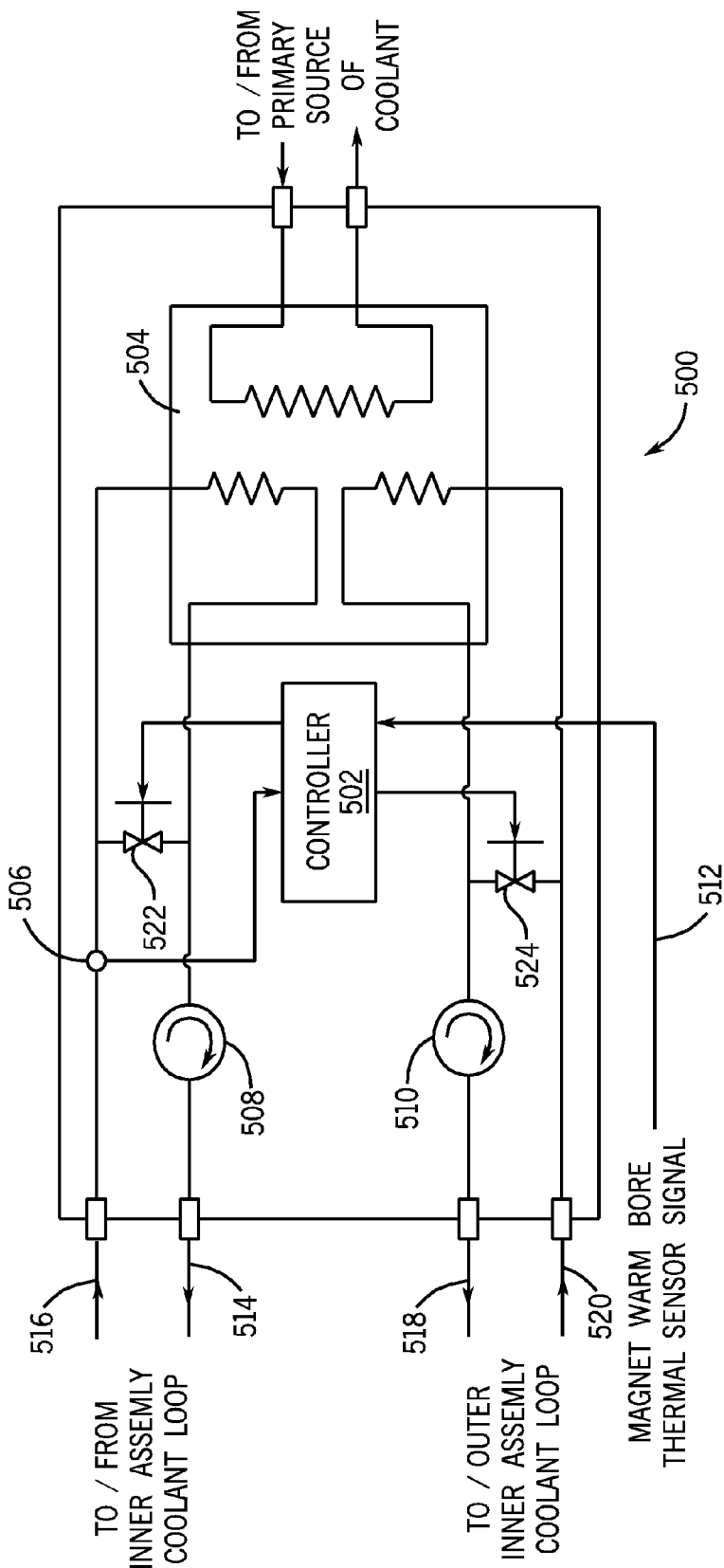

SYSTEM, METHOD AND APPARATUS FOR
CONTROLLING THE TEMPERATURE OF A
MRI MAGNET WARM BORE

FIELD OF THE INVENTION

The present invention relates generally to a magnetic resonance imaging (MRI) system and in particular to a system, method and apparatus for controlling the temperature of a MRI magnet warm bore and cooling a gradient coil assembly.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. An MRI system may use a shielded gradient coil that consists of inner and outer gradient coil assemblies potted together with a material such as epoxy resin. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

During a patient scan, the gradient coil(s) of the gradient coil assembly that produce the magnetic field gradients dissipate large amounts of heat. The heat produced by the gradient coils can cause an increase in the temperature of the MRI system's patient bore and the magnet warm bore. Heating of the patient bore may reduce the amount of RF power that can be transmitted during imaging which in turn can affect the efficiency of the MRI system. In addition, an increase in temperature of the patient bore can be uncomfortable for a patient and may even become dangerous unless safety interlocks are designed to prevent overheating. Minimizing any increase in temperature of the patient bore is important to MRI scanner efficiency and safety.

The heat produced by the gradient coils may be removed from the gradient coil assembly by a cooling assembly that may include, for example, a remote heat exchanger/chiller and cooling tube(s) positioned at a given distance from the heat conductors. For a shielded gradient coil, a cooling tube may be provided for the inner gradient coil assembly and a cooling tube may be provided for the outer gradient coil assembly. A liquid coolant, such as water, ethylene or a propylene glycol mixture, absorbs heat from the gradient coils as it is pumped through the cooling tubes and transports the heat to the remote heat exchanger/chiller. Heat may then be ejected to the atmosphere by way of the heat exchanger/chiller. The cooling tubes for the inner gradient coil assembly and the outer gradient coil assembly of a shielded gradient coil typically have a common cooling circuit, i.e., a common supply of chilled coolant. Generally, the chilled coolant is supplied at a temperature that removes the maximum amount of heat possible without causing condensation and also attempts to keep the patient bore temperature as close to room temperature as possible.

An increase in temperature of the magnet warm bore can also affect performance of the MRI system. A magnet warm bore surface is typically made of low magnetic permeability stainless steel, however, the stainless steel may have residual permeability, also known as ferromagnetism. According to Curie's law, the permeability of a ferromagnetic material changes as the temperature of the ferromagnetic material changes. A change in permeability of the magnet warm bore may result in a change in the intensity of the magnetic field, $B_0$, generated by the magnet which can have a negative impact on image quality. As mentioned above, however, the cooling assemblies for a gradient coil are typically configured to remove as much heat as possible and minimize the patient bore temperature. Such cooling assemblies do not specifically address the problems caused by temperature changes in the magnet warm bore.

It would be desirable to provide a system for controlling the temperature of the magnet warm bore, in particular, for maintaining a constant warm bore temperature. It would also be advantageous to provide a cooling assembly that can both maintain a constant warm bore temperature and minimize the patient bore temperature.

BRIEF DESCRIPTION OF THE INVENTION

In accordance with an embodiment, an apparatus for cooling a gradient coil assembly of a magnetic resonance imaging (MRI) system, the gradient coil assembly having an inner gradient coil assembly and an outer gradient coil assembly, includes a first cooling circuit having at least one cooling tube positioned at a distance from the inner gradient coil assembly, the at least one cooling tube configured to transport a first coolant having a first temperature, a second cooling circuit having at least one cooling tube positioned at a distance from the outer gradient coil assembly, the at least one cooling tube configured to transport a second coolant having a second temperature, and a controller coupled to the first cooling circuit and the second cooling circuit and configured to independently control the first temperature of the first coolant and the second temperature of the second coolant.

In accordance with another embodiment, a method for controlling a temperature of a magnet warm bore of a magnet assembly for a magnetic resonance imaging (MRI) system, the magnet assembly including a gradient coil having an inner gradient coil assembly and an outer gradient coil assembly, includes providing a first coolant having a first coolant temperature to a cooling tube of a first cooling assembly for the inner gradient coil assembly, providing a second coolant having a second coolant temperature to a cooling tube of a second cooling assembly for the outer gradient coil assembly, measuring a temperature of the warm bore, and adjusting the second coolant temperature based at least on the temperature of the warm bore.

In accordance with another embodiment, a system for controlling a temperature of a magnet warm bore of a magnet assembly for a magnetic resonance imaging (MRI) system, the magnet assembly including a gradient coil having an inner gradient coil assembly and an outer gradient coil assembly, includes a heat exchanger, a controller coupled to the heat exchanger, a first cooling circuit coupled to the heat exchanger and the controller, the first cooling circuit comprising a coolant line positioned at a distance from the inner gradient coil assembly and configured to transport a first coolant having a first temperature, and a second cooling circuit coupled to the heat exchanger and the controller, the first cooling circuit comprising a coolant line positioned at a distance from the outer gradient coil assembly and configured to transport a second coolant having a second temperature. The controller is configured to control the heat exchanger to provide the first coolant at the first temperature and the second coolant at the second temperature.

BRIEF DESCRIPTION OF THE DRAWINGS

The invention will become more fully understood from the following detailed description, taken in conjunction with the accompanying drawings, wherein like reference numerals refer to like parts, in which:

FIG. 5 is a schematic block diagram of cooling circuits for a gradient coil cooling assembly in accordance with an embodiment.

DETAILED DESCRIPTION

Figure 1:
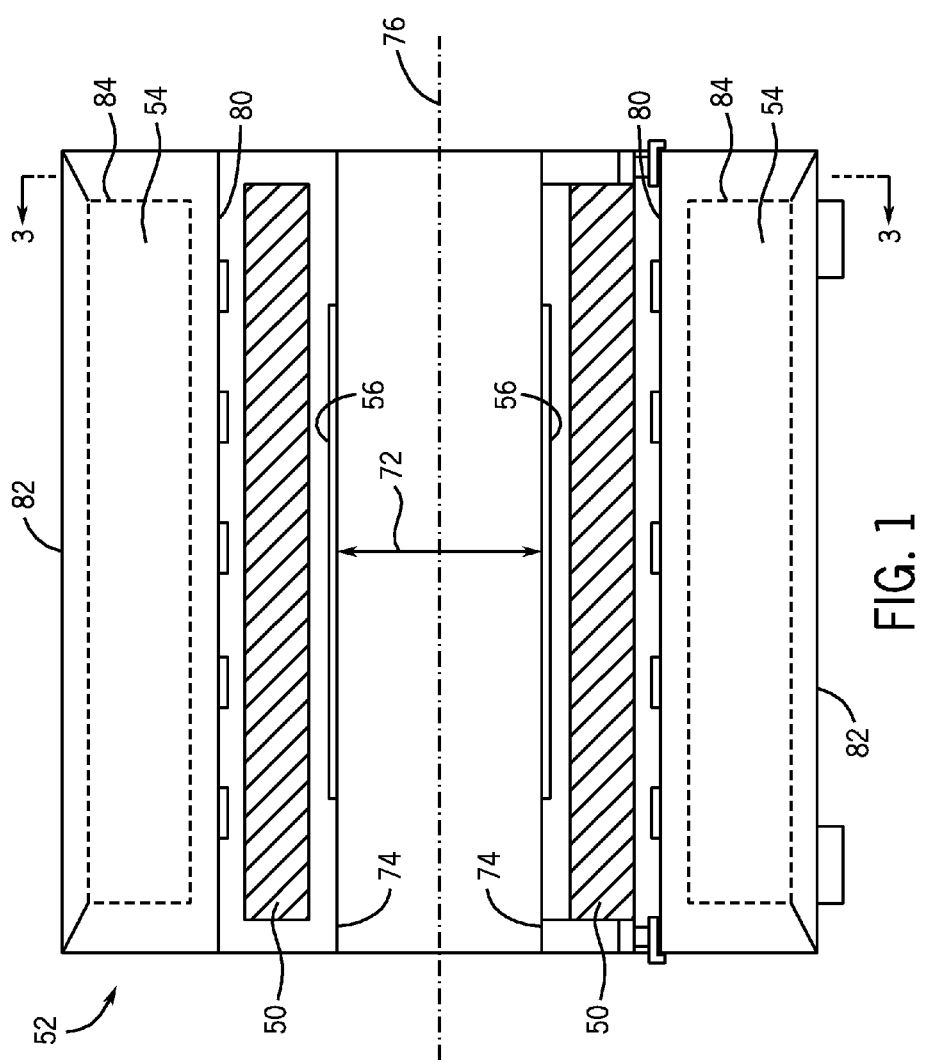
FIG. 1 is a cross-sectional side elevation view of an exemplary magnet assembly in accordance with an embodiment.

FIG. 1 is a cross-sectional side elevation view of an exemplary magnet assembly in accordance with an embodiment. Magnet assembly 52 is cylindrical and annular in shape. The main components of the magnet assembly 52 are superconducting magnet 54, gradient coil assembly 50 and RF coil 56. Various other elements, such as supports, suspension members, end caps, brackets, etc. are omitted from FIG. 1 for clarity. A cylindrical imaging volume 72 is surrounded by a patient bore tube 74. RF coil 56 is mounted on an outer surface of the patient bore tube 74 and mounted inside the gradient coil assembly 50. The gradient coil assembly 50 is disposed around the RF coil 56 in a spaced apart coaxial relationship and the gradient coil assembly 50 circumferentially surrounds the RF coil 56. Gradient coil assembly 50 is mounted inside magnet 54 and is circumferentially surrounded by magnet 54.

A patient or imaging subject (not shown) may be inserted into the magnet assembly 52 along a center axis 76 on a patient table or cradle (not shown). Center axis 76 is aligned along the tube axis of the magnet assembly 52 parallel to the direction of a main magnetic field, $B_0$, generated by the magnet 54. RF coil 56 is used to apply a radio frequency magnetic field pulse to a patient or subject and to receive MR information back from the subject, as is well known in the art of MR imaging. Gradient coil assembly 50 generates time dependent gradient magnetic pulses in a known manner.

Superconducting magnet 54 may include, for example, several radially aligned and longitudinally spaced-apart superconductive main coils (not shown), each capable of carrying a large, identical electric current in the same direction. The superconductive main coils are designed to create a magnetic field, $B_0$, of high uniformity within the imaging volume 72. Superconducting magnet 54 is enclosed by a magnet vessel 84. Magnet vessel 84 may include, for example, a helium vessel and thermal or cold shields for containing and cooling the magnet windings in a known manner. Magnet vessel 84 also prevents heat from being transferred to the superconducting magnet. A warm bore 80 is defined by an inner cylindrical surface of the magnet assembly and is typically made of metal such as stainless steel. A cryostat shell 82 covers the outer surface of the magnet assembly and is generally metallic, typically steel or stainless steel.

Figure 2:
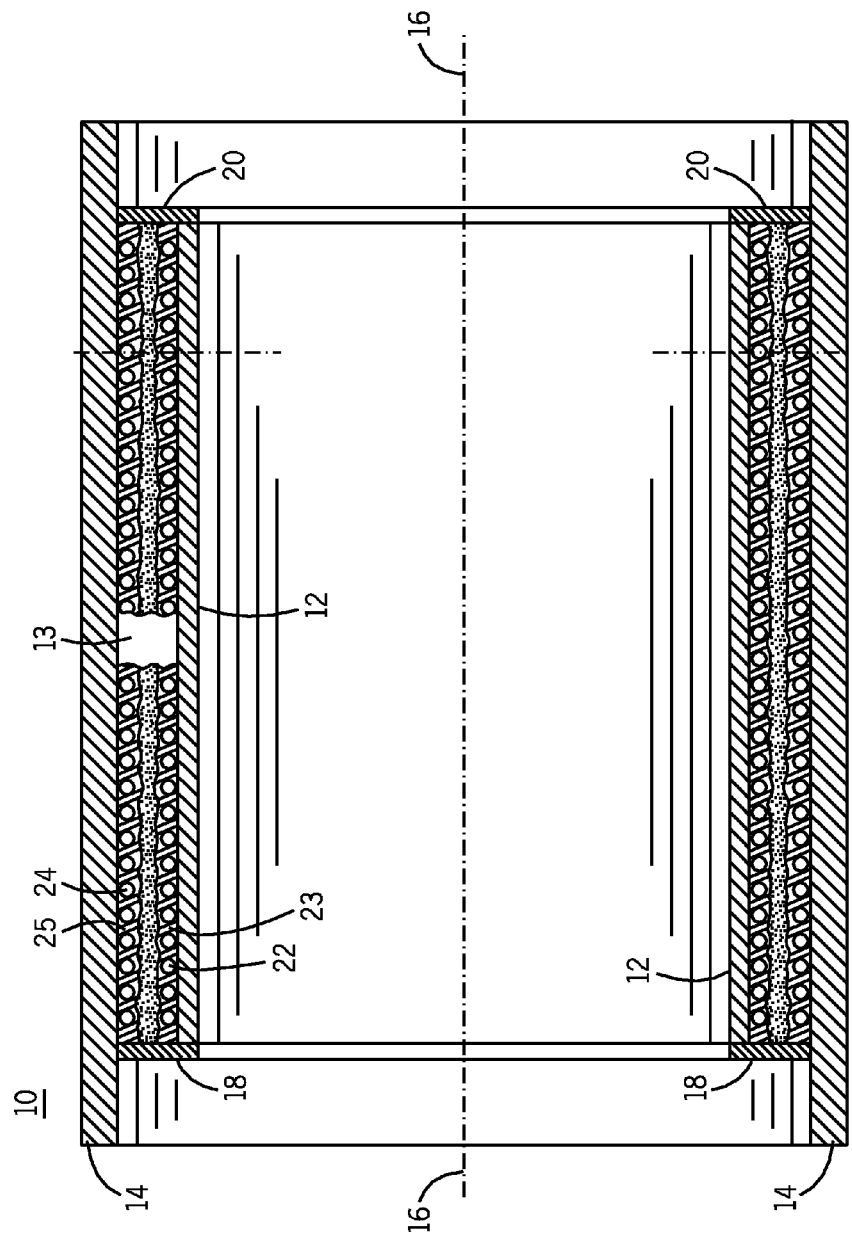
FIG. 2 is a sectional view, taken in a plane through a central longitudinal axis, of an exemplary MR gradient coil set assembly in accordance with an embodiment.

Gradient coil assembly 50 may be a self-shielded gradient coil assembly. FIG. 2 shows an exemplary self-shielded gradient coil assembly 10 for an MR imaging system (not shown). FIG. 2 is a sectional view, taken in a plane through a central longitudinal axis of an exemplary MR gradient coil assembly in accordance with an embodiment. In FIG. 2, the gradient coil assembly 10 comprises a cylindrical inner gradient coil assembly or winding 12 and a cylindrical outer gradient coil assembly or winding 14 disposed in concentric arrangement with respect to a common axis 16. Inner gradient coil assembly 12 includes inner coils of X-, Y- and Z-gradient coil pairs, or sets, and outer gradient coil assembly 14 includes the respective outer coils of the X-, Y- and Z-gradient coils pairs or sets. Gradient coil assembly 10, shown in FIG. 2, may be inserted into the bore of a main magnet (such as magnet 54 shown in FIG. 1) of an MRI system so that axis 16 aligns with the bore axis of the main magnet. The coils of gradient coil assembly 10 may be activated by passing an electric current through the coils to generate a gradient field in the bore as required in MR imaging.

A volume 13 of space between inner gradient coil assembly 12 and outer gradient coil assembly 14 may be filled with a bonding material, e.g., epoxy resin. Inner gradient coil assembly 12 and outer gradient coil assembly 14 may be joined at their respective ends to end rings 18 and 20. The end rings 18 and 20 are provided to hold the inner gradient coil assembly 12 and the outer gradient coil assembly 14 in a radially spaced apart coaxial relationship. End rings 18 and 20 may be fixed to the inner gradient coil assembly 12 and the outer gradient coil assembly 14 using fastening devices (not shown) such as brackets, screws, etc. End rings 18 and 20 hold the inner and outer gradient coil assemblies 12 and 14 in the desired spaced apart coaxial relationship while the epoxy (or other bonding material) in volume 13 cures or sets up. After the epoxy has cured, the end rings 18 and 20 are typically removed.

Heat dissipated from the gradient coil assembly 10 during operation may increase the temperature of the patient bore 74 (shown in FIG. 1) and the warm bore 80 (shown in FIG. 1) of a magnet assembly. A cooling system or apparatus may be provided to reduce the heat generated by the gradient coils of the gradient coil assembly 10. A continuous cooling tube 22 may be wound in a helix about an outer diameter surface of inner gradient coil assembly 12 and a corresponding continuous cooling tube 24 is formed in a helix on an inner diameter surface of outer gradient coil assembly 14. Alternatively, the cooling tubes 22 and 24 may be formed on the corresponding gradient coil assembly by snaking the cooling tube up and down the gradient coil assembly. Tubes 22 and 24 are held in place by, for example, layers of epoxy 23 and 25, respectively. Cooling tubes 22 and 24 may be affixed by respective epoxy layers 23 and 25 to the opposing surfaces of inner and outer gradient coil assemblies 12 and 14 as individual separated units, and the epoxy material is then allowed to cure. In an embodiment, the epoxy used in volume 13 (as well as to affix cooling tubes 22 and 24) may contain alumina particulate material to increase its thermal conductivity. This enhances the effectiveness of the epoxy in conducting heat, generated by the respective gradient coils, away from inner and outer gradient coil assemblies 12 and 14 and to cooling tubes 22 and 24. In addition to providing good thermal conductivity, the epoxy layer is air cured and is provided with a mechanical strength to resist the forces generated when electric currents are coupled to gradient coils.

Figure 3:
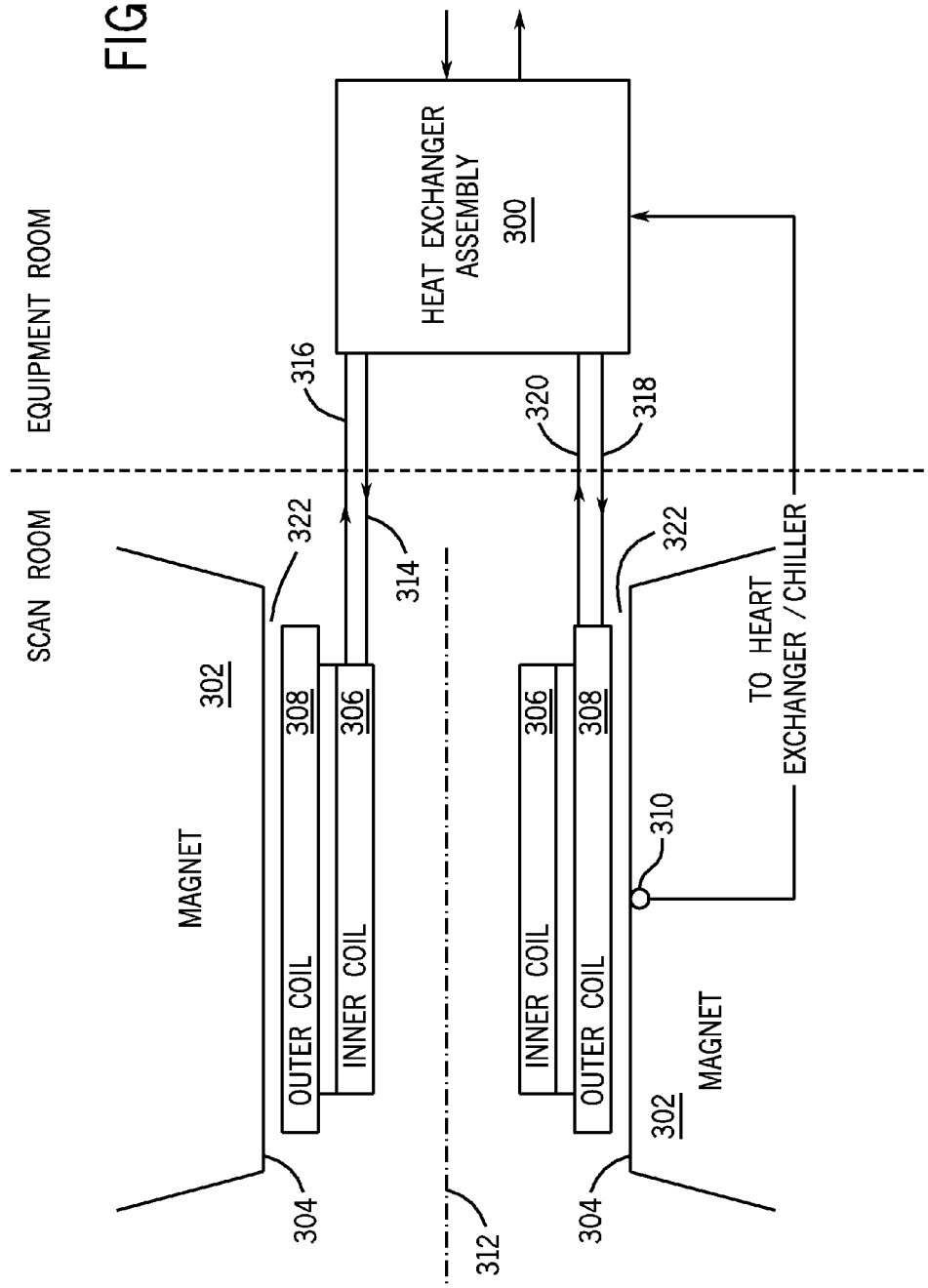
FIG. 3 is a schematic cross-sectional view of a magnet assembly including a gradient coil cooling assembly in accordance with an embodiment.
Figure 4:
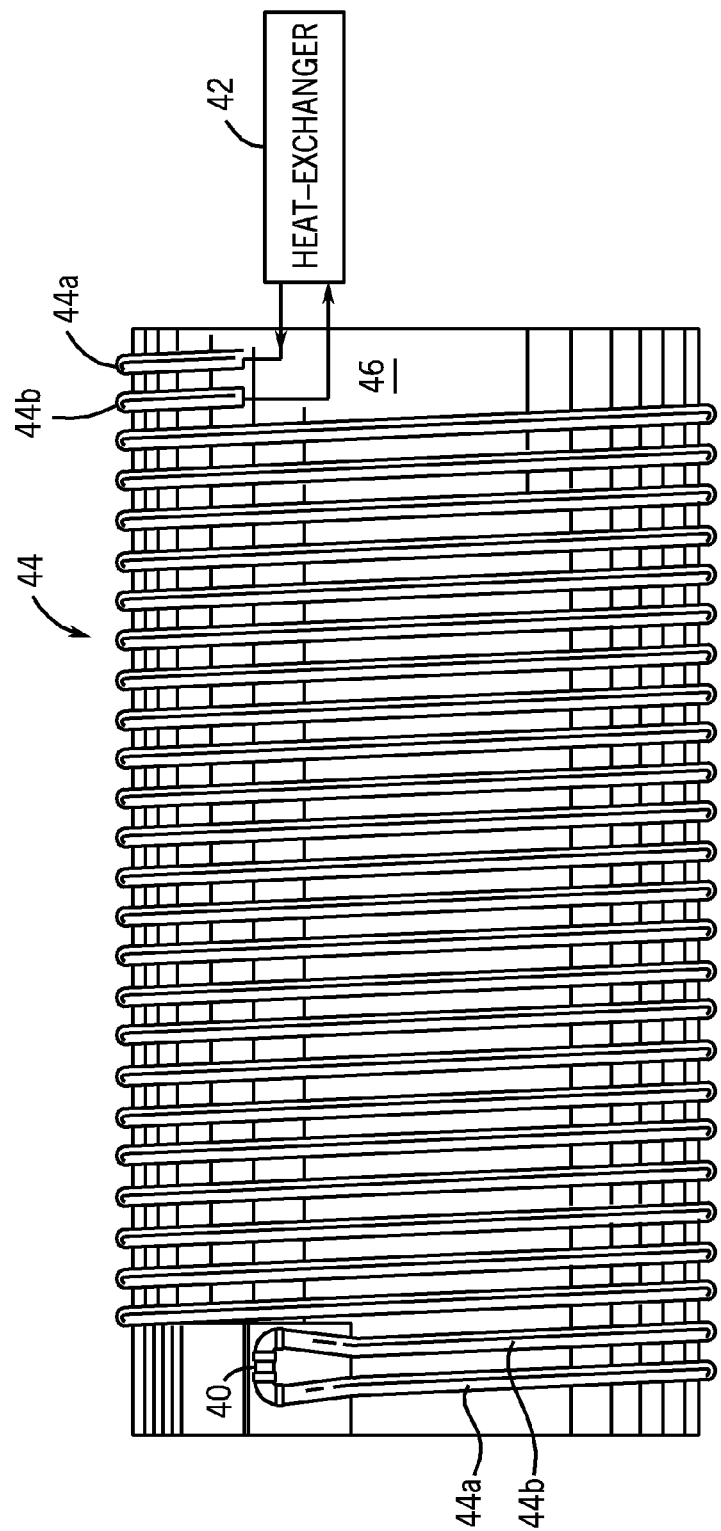
FIG. 4 is a side elevation view of an exemplary gradient coil winding and an associated heat exchanger in accordance with an embodiment.

Cooling tubes 22 and 24 may be coupled to a heat exchanger as shown in FIGS. 3 and 4. FIG. 3 is a schematic cross-sectional view of a magnet assembly including a gradient coil cooling assembly in accordance with an embodiment. In FIG. 3, the RF coil and various other elements are omitted for clarity. A cooling tube (not shown) for the inner gradient coil assembly 306 is coupled to a heat exchanger assembly 300 via a coolant feed line 314 and a coolant return line 316. A cooling tube (not shown) for the outer gradient coil assembly 308 is coupled to heat exchanger assembly 300 via a coolant feed line 318 and a coolant return line 320. The coolant tubes may be, for example, plastic or metallic piping configured to carry a coolant such as, for example, water, ethylene or a propylene glycol mixture. Alternatively, the cooling tubes may be a hollow conductor configured to carry both a coolant and an electrical current. As discussed above with respect to FIG. 2, the coolant tubes may be wound around or formed on the surfaces of the inner and outer gradient coil assemblies 306 and 308. FIG. 4 shows an exemplary cooling tube 44 which is wrapped in a helix around a gradient coil winding 46 and may comprise a single continuous length, or two separate lengths of tubing 44a and 44b. One end of each of tubing 44a and 44b is joined to a coupling 40 attached to gradient coil winding 46 at the leftward end thereof, as viewed in FIG. 4. Coupling 40 provides a passage to direct flow of coolant fluid from one of the lengths of tubing 44a and 44b, into the other, rendering them effectively continuous. Tubing lengths 44a and 44b are wrapped around gradient coil winding 46 in an alternating helical manner and the ends thereof, located at the rightward end of gradient coil winding 46 as viewed in FIG. 4, are coupled to a heat exchanger 42. While not shown in FIG. 4, coolant tubing alternatively may be formed in a helical manner on an internal surface of a gradient coil winding. As mentioned above, in an alternative embodiment, a cooling tube 44 may be formed on the corresponding gradient coil assembly by snaking the cooling tube up and down the gradient coil assembly.

Returning to FIG. 3, heat exchanger assembly 300 directs coolant to the cooling tubes via feed lines 314 and 318 for circulation around the inner gradient coil assembly 306 and the outer gradient coil assembly 308, respectively. The coolant returns through return lines 316 and 320 to heat exchanger assembly 300. The heat exchanger assembly 300 may be located remotely from the magnet assembly, for example, the heat exchanger assembly 200 may be located in an equipment room while the magnet assembly is located in a separate scan room. Heat exchanger assembly 300 is configured to provide separate cooling circuits, one for the inner gradient coil assembly 306 and one for the outer gradient coil assembly 308. In particular, the cooling circuits of heat exchanger assembly 300 are configured so that the cooling circuit for the inner gradient coil assembly 306 and the cooling circuit for the outer gradient coil assembly 308 have separate supplies of coolant. Accordingly, the outer gradient coil assembly 308 (and, therefore, the magnet warm bore 304) may be maintained at a different temperature than the inner gradient coil assembly 306. In particular, the cooling circuit for the outer gradient coil assembly 308 may be configured to maintain the magnet warm bore 304 at a constant temperature to, for example, provide stability to the magnetic field, $B_0$, and the cooling circuit for the inner gradient coil assembly 306 may be configured to remove a maximum amount of heat and to minimize the temperature of the patient bore 74 (shown in FIG. 1).

FIG. 5 is a schematic block diagram of cooling circuits for a gradient coil cooling assembly in accordance with an embodiment. A heat exchanger assembly 500 includes a first cooling circuit for the inner gradient coil assembly. The first cooling circuit includes, among other elements, a coolant feed line 514, a coolant return line 516 and a pump 508. The coolant feed line 514 and the coolant return line 516 are connected to a heat exchanger/chiller 504 (for example, a plate heat exchanger) and to the cooling tube (not shown) of the inner gradient coil assembly coolant loop. Heat exchanger/chiller 504 is also connected to a primary source of coolant (not shown). A second cooling circuit is provided for the outer gradient coil assembly and includes, among other elements a coolant feed line 518, a coolant return line 520 and a pump 510. The coolant feed line 518 and coolant return line 520 are connected to the heat exchanger/chiller 504 and to the cooling tube (not shown) of the outer gradient coil assembly coolant loop. The first cooling circuit is completely separate from the second cooling circuit. Accordingly, the coolant for the first cooling circuit may be provided at a different temperature than the coolant for the second cooling circuit.

A controller 502 is coupled to the first cooling circuit and to the second cooling circuit. Controller 502 is a two-channel controller and is configured to control the temperature of the coolant in the first cooling circuit and the temperature of the coolant in the second cooling circuit separately. Controller 502 may include various types of control circuitry, digital and/or analog, and may include a microprocessor, microcontroller, application specific integrated circuit (ASIC), or other digital and/or analog circuitry configured to perform various input/output, control, analysis and other functions to be described herein. Controller 502 is connected to an adjustable control valve 522 that is coupled to the first cooling circuit. Controller 502 and adjustable control valve 522 may be used to control (e.g., increase or decrease) the amount of coolant that flows through the heat exchanger/chiller 504 for the first cooling circuit. Controller 502 is also connected to a separate adjustable control valve 524 that is coupled to the second cooling circuit. Controller 502 and adjustable-control valve 524 may be used to control (e.g., increase or decrease) the amount of coolant that flows through the heat exchanger/chiller 504 for the second cooling circuit. As mentioned above, the temperature of the coolant for the first cooling circuit is controlled independently of the temperature of the coolant for the second cooling circuit.

For the first cooling circuit, controller 502 is configured to provide coolant at a constant temperature. Preferably, the coolant is at a temperature that maximizes heat removal. In addition, the coolant for the inner gradient coil cooling assembly may be maintained at a temperature that minimizes the patient bore tube temperature or minimizes a temperature increase of the patient bore tube, for example, maintains the patient bore temperature as close to room temperature as possible. A temperature (or thermal) sensor 506 may be positioned in the coolant lines of the first cooling circuit in order to measure and monitor the coolant temperature. A temperature signal indicating the coolant temperature is provided from the temperature sensor 506 to controller 502. Controller 502 may then adjust the flow of coolant through the heat exchanger/chiller 504 via adjustable control valve 522 and thereby increase or decrease the cooling effort to maintain the coolant at a desired temperature.

For the second cooling circuit, controller 502 is configured to adjust the coolant temperature to control the temperature of the outer gradient coil assembly and the temperature of the magnet warm bore. In particular, the coolant temperature is adjusted to maintain the magnet warm bore at a constant temperature. A constant magnet warm bore temperature helps provide a constant main magnetic field, $B_0$, and provide good image quality. The temperature of the coolant in the outer gradient coil assembly coolant loop may be varied in order to maintain a constant warm bore temperature. A predetermined desired temperature for the warm bore is set, for example, an elevated temperature such as 35° C. may be desired for the warm bore. Controller 502 (in conjunction with other elements of the cooling assembly) operates to vary the coolant temperature to maintain the warm bore temperature at the desired temperature. For example, while the MR system is idle, controller 502 may control the coolant temperature (e.g., by providing instructions to heat exchanger/chiller 504) to be the desired temperature of the warm bore, e.g., 35° C. Although the energy dissipated through friction in the cooling circuit (e.g., the cooling tubes) may be sufficient to elevate the temperature of the coolant if no cooling effort is applied, elevating the coolant temperature (e.g., to 35° C.) may require the used of heaters (not shown) in the heat exchanger assembly 500. A warm bore thermal sensor 310 (shown in FIG. 3) may be positioned on the magnet warm bore 304 (shown in FIG. 3) to measure and monitor the temperature of the magnet warm bore. A signal 512 from the thermal sensor 310 is provided to controller 502 to indicate the temperature of the warm bore. During a MR scan, as the warm bore temperature increases (e.g., as a result of heat generated by the outer gradient coil assembly) controller 502 receives the warm bore thermal sensor signal 512 indicating the temperature of the warm bore. Based on signal 512, controller 502 may instruct the heat exchanger/chiller 504 to reduce the temperature of the coolant for the outer gradient coil assembly cooling circuit to maintain the warm bore at the desired temperature, e.g., a constant 35° C. In addition, controller 502 may adjust the flow of coolant through the heat exchanger/chiller 504 via adjustable control valve 524 and thereby increase or decrease the cooling effort. After the MR scan, controller 502 continues to receive signal 512 indicating the warm bore temperature and may continue to instruct the heat exchanger/chiller 504 to adjust (e.g., increase or decrease) its cooling effort for the coolant accordingly to maintain the warm bore temperature at the desired temperature, e.g., a constant 35° C.

Returning to FIG. 3, additional measures may be implemented in the magnet assembly to ensure an efficient heat transfer between the outer gradient coil 308 and the warm bore 304 of superconducting magnet 302. For example, a radial gap 322 between the gradient coil and magnet 302 may be kept as small as possible. The surfaces of the outer gradient coil assembly 308 and warm bore 304 may also be roughened to increase radiation efficiency. In addition, the gap 322 may be filled with a thermally conductive compound.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. An apparatus for cooling a gradient coil assembly of a magnetic resonance imaging (MRI) system, the gradient coil assembly having an inner gradient coil assembly and an outer gradient coil assembly, the apparatus comprising:
   a first cooling circuit having at least one cooling tube positioned at a distance from the inner gradient coil assembly, the at least one cooling tube configured to transport a first coolant having a first temperature;
   a second cooling circuit having at least one cooling tube positioned at a distance from the outer gradient coil assembly, the at least one cooling tube configured to transport a second coolant having a second temperature; and
   a controller coupled to the first cooling circuit and the second cooling circuit and configured to independently control the first temperature of the first coolant and the second temperature of the second coolant.

2. An apparatus according to claim 1, wherein the first temperature of the first coolant is controlled by the controller to minimize a temperature increase of a patient bore of the MRI system.

3. An apparatus according to claim 1, wherein the second temperature is controlled by the controller to maintain a temperature of a warm bore of the MRI system at a constant desired temperature.

4. An apparatus according to claim 1, further comprising a thermal sensor positioned in the first cooling circuit and coupled to the controller, the thermal sensor configured to measure the first temperature of the first coolant.

5. An apparatus according to claim 3, further comprising a thermal sensor positioned on the warm bore and coupled to the controller, the thermal sensor configured to measure the temperature of the warm bore.

6. An apparatus according to claim 5, wherein the thermal sensor provides a signal to the controller indicating the temperature of the warm bore and the controller controls the second temperature of the second coolant based at least one the temperature of the warm bore.

7. A method for controlling a temperature of a magnet warm bore of a magnet assembly for a magnetic resonance imaging (MRI) system, the magnet assembly including a gradient coil having an inner gradient coil assembly and an outer gradient coil assembly, the method comprising:

provding a first coolant having a first coolant temperature to a cooling tube of a first cooling assembly for the inner gradient coil assembly;

providing a second coolant having a second coolant temperature to a cooling tube of a second cooling assembly for the outer gradient coil assembly;

measuring a temperature of the warm bore; and adjusting the second coolant temperature based at least on the temperature of the warm bore.

8. A method according to claim 7, wherein the second coolant temperature is adjusted to maintain the temperature of the warm bore at a constant predetermined temperature.

9. A method according to claim 7, wherein the first coolant temperature is a constant temperature configured to minimize a temperature increase of a patient bore of the MRI system.

10. A method according to claim 7, further comprising repeating measuring the temperature of the warm bore and adjusting the second coolant temperature during operation of the MRI system.

11. A method according to claim 7, further comprising repeating measuring the temperature of the warm bore and adjusting the second coolant temperature during a idle period of the MRI system.

12. A system for controlling a temperature of a magnet warm bore of a magnet assembly for a magnetic resonance imaging (MRI) system, the magnet assembly including a gradient coil having an inner gradient coil assembly and an outer gradient coil assembly, the system comprising:

a heat exchanger;

a controller coupled to the heat exchanger;

a first cooling circuit coupled to the heat exchanger and the controller, the first cooling circuit comprising a coolant line positioned at a distance from the inner gradient coil assembly and configured to transport a first coolant having a first temperature; and a second cooling circuit coupled to the heat exchanger and the controller, the first cooling circuit comprising a coolant line positioned at a distance from the outer gradient coil assembly and configured to transport a second coolant having a second temperature;

wherein the controller is configured to control the heat exchanger to provide the first coolant at the first temperature and the second coolant at the second temperature.

13. A system according to claim 12, wherein the first temperature of the first coolant is controlled by the controller to minimize a temperature increase of a patient bore of the MRI system.

14. A system according to claim 12, wherein the second temperature is controlled by the controller to maintain the temperature of the warm bore at a constant predetermined temperature.

15. A system according to claim 14, further comprising a thermal sensor positioned on the warm bore and coupled to the controller, the thermal sensor configured to measure the temperature of the warm bore.

16. A system according to claim 15, wherein the thermal sensor provides a signal to the controller indicating the temperature of the warm bore and the controller controls the heat exchanger to adjust the second temperature of the second coolant based at least on the temperature of the warm bore.

* * * * *